(12) United States Patent
Chang et al.

(10) Patent No.: US 7,956,403 B2
(45) Date of Patent: Jun. 7, 2011

(54) TWO-BIT FLASH MEMORY

(75) Inventors: Ming-Cheng Chang, Taipei County (TW); Wei-Ming Liao, Taipei (TW); Jer-Chyi Wang, Taoyuan County (TW); Yi-Feng Chang, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 159 days.

(21) Appl. No.: 12/099,168

(22) Filed: Apr. 8, 2008

(65) Prior Publication Data

US 2009/0085089 A1 Apr. 2, 2009

(30) Foreign Application Priority Data

Oct. 2, 2007 (TW) .............................. 96136913 A (51) Int. Cl.
*H01L 29/788* (2006.01)
(52) U.S. Cl. ......... 257/316; 257/239; 257/261; 257/315
(58) Field of Classification Search .................. 257/239, 257/261, 314, 315, 316, E29.129, E29.3, 257/E21.179, E21.422, E21.68
See application file for complete search history.

(56) References Cited

U.S. PATENT DOCUMENTS

| 2006/0202285 A1* | 9/2006 | Kamiya et al. ................ 257/390 |
| 2007/0158732 A1* | 7/2007 | Kim .............................. 257/314 |
| 2007/0215954 A1 | 9/2007 | Mouli |
| 2007/0290223 A1* | 12/2007 | Yagishita ...................... 257/103 |

OTHER PUBLICATIONS

"Office Action of Taiwan Counterpart Application", issued on Jan. 25, 2011, p. 1-p. 5, in which the listed reference was cited.

* cited by examiner

*Primary Examiner* — N Drew Richards
*Assistant Examiner* — Joannie A Garcia
(74) *Attorney, Agent, or Firm* — Jianq Chyun IP Office (57) ABSTRACT

A flash memory includes a substrate with a protrusion, a control gate, two floating gates, and a dielectric layer. The protrusion extends from a top face of the substrate. The control gate is formed on the protrusion of the substrate and extendedly covers opposite sidewalls of the protrusion. The floating gates are respectively formed on top of the protrusion and being on two opposite sides of the control gate. The dielectric layer is sandwiched the control gate and each of the two floating gates. Because of the arcuate control gate used in the flash memory, the controllability of the control gate is increased and the memory cell window is enhanced.

8 Claims, 8 Drawing Sheets

TWO-BIT FLASH MEMORY

CROSS-REFERENCE TO RELATED APPLICATION

This application claims the priority benefit of Taiwan application serial no. 96136913, filed on Oct. 2, 2007. The entirety the above-mentioned patent application is hereby incorporated by reference herein and made a part of specification.

BACKGROUND OF THE INVENTION

1. Field of the Invention

The present invention relates to a two-bit flash memory technology. More particularly, the present invention relates to a two-bit flash memory capable of increasing controllability of a control gate.

2. Description of Related Art

In various kinds of non-volatile memories, an electrically erasable programmable read-only memory (EEPROM), capable of saving programmed information without being limited by the ON/OFF of the power supply, has been widely used by personal computers and electronic devices. A non-volatile memory called "flash memory" has become one of the important memory elements on the market, due to the mature technology and low cost.

Figure 1:
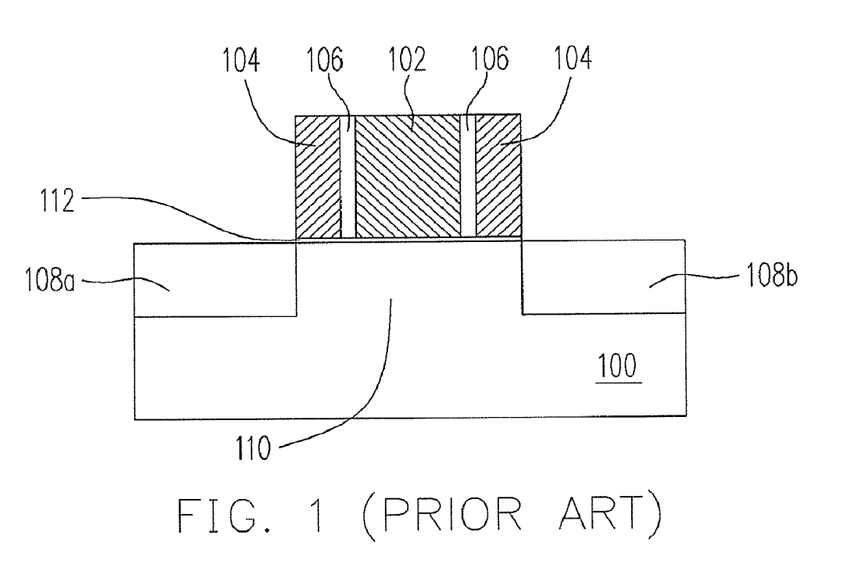
FIG. 1 is a perspective structural view of a conventional two-bit flash memory.

Generally, the flash memory is formed by sequentially stacking a tunneling oxide layer, a floating gate, a dielectric layer, and a control gate on a substrate. However, as the element becomes increasingly small, the current flash memory cell is also continuously improved. Recently, a "two-bit flash memory" has been developed, which is approximately shown in FIG. 1. A control gate 102 is fabricated like a fish fin perpendicularly standing on a flat substrate 100, and floating gates 104 are disposed on two sides of the fish-fin-shaped control gate 102. dielectric layers 106 are sandwiched by the control gate 102 and the floating gates 104. A source 108a and a drain 108b are disposed in the substrate 100 on two sides of the floating gates 104, and a channel region 110 is formed there-between. In addition, a tunneling oxide layer 112 is sandwiched by the floating gates 104 and the substrate 100.

However, currently, in order to cater to the development of semiconductor manufacturing process for the 60 nm generation, the channel length of the two-bit flash memory must be shortened. Due to the short channel effect (SCE), the controllability of the control gate is greatly reduced, and as a result, the memory cell window is insufficient.

SUMMARY OF THE INVENTION

Accordingly, the present invention is directed to a flash memory, capable of increasing the controllability of the control gate.

The present invention is further directed to a flash memory, capable of enhancing the memory cell window.

As embodied and broadly described herein, the present invention provides a flash memory, which includes a substrate having a protrusion extending from a top face of the substrate, a control gate, two floating gates, and a dielectric layer. The control gate is formed on the protrusion of the substrate and extendedly covers two opposite sidewalls of the protrusion. The floating gates are respectively formed on top of the protrusion and being on two opposite sides of the control gate. The dielectric layer is sandwiched by the control gate and each of the two floating gates.

In an embodiment of the present invention, the flash memory further includes a plurality of isolation structures formed on two opposite sides of the protrusion to sandwich therebetween a source and a drain respectively formed on two opposite sides of the protrusion and each being adjacent to one of the two floating gates. A top surface of the isolation structures is coplanar with that of the two floating gates, or it has a height lower than that of a bottom surface of the two floating gates.

In an embodiment of the present invention, the dielectric layer is further sandwiched by the control gate and the protrusion.

In an embodiment of the present invention, the flash memory further includes an insulating layer sandwiched by the two floating gates and the protrusion.

The present invention further provides a flash memory, which includes a substrate having a channel region, a source and a drain, two floating gates, a control gate, an insulating layer, and a dielectric layer. The channel region includes first opposite sides and second opposite sides. The source and the drain are respectively formed on a first set of two opposite sides of the channel region in the substrate, and the control gate is formed on top of the channel region to cover a portion of a second set of two opposite sides of the channel region. The two floating gates are respectively formed on two opposite sidewalls of the control gate and on top of the channel region. The insulating layer is sandwiched by each of the two floating gates and the channel region, and the dielectric layer is sandwiched by the control gate and the floating gates.

In another embodiment of the present invention, the first set of two opposite sides are orthogonal to the second set of two opposite sides of the channel region.

In another embodiment of the present invention, the flash memory further includes a plurality of isolation structures formed on the second set of two opposite sides of the channel region to sandwich therebetween a source and a drain respectively formed on the first set of two opposite sides of the channel region and each of the source and the drain being adjacent to one of the two floating gates.

In another embodiment of the present invention, a top surface of the isolation structures is coplanar with that of the two floating gates.

In another embodiment of the present invention, the top surface of the isolation structures has a height lower than that of a bottom surface of the two floating gates.

In another embodiment of the present invention, the dielectric layer is further sandwiched by the control gate and the channel region.

In all embodiments of the present invention, the dielectric layer includes an oxide-nitride-oxide structure.

In the flash memory of the present invention, the arcuate-shaped control gate is adopted, and the additional gate portion near the channel region is utilized to increase the controllability of the control gate, so as to enhance the memory cell window.

In order to make the aforementioned and other features and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention is fully described below with reference to the accompanying drawings. A plurality of embodiments of the present invention is shown in the accompanying drawings. However, the present invention can be implemented through various difference forms, which should not be interpreted as being limited by the embodiments described in the present invention. Practically, the embodiments are provided to make the present invention be more specific and complete, and to fully convey the scope of the present invention to those of ordinary skill in the art. In the drawings, in order to be explicit, the size and relative size of each layer and region may be exaggeratedly shown.

It should be understand that, although "first", "second", and other terms may be used in the present invention to describe various elements, regions, layers, and/or portions, the terms are only used to differentiate one element, region, layer, or portion from another, but not to limit the elements, regions, layers, and/or portions. Therefore, without departing from the teaching of the present invention, the above first element, region, layer, or portion can be called a second element, region, layer, or portion.

Figure 2:
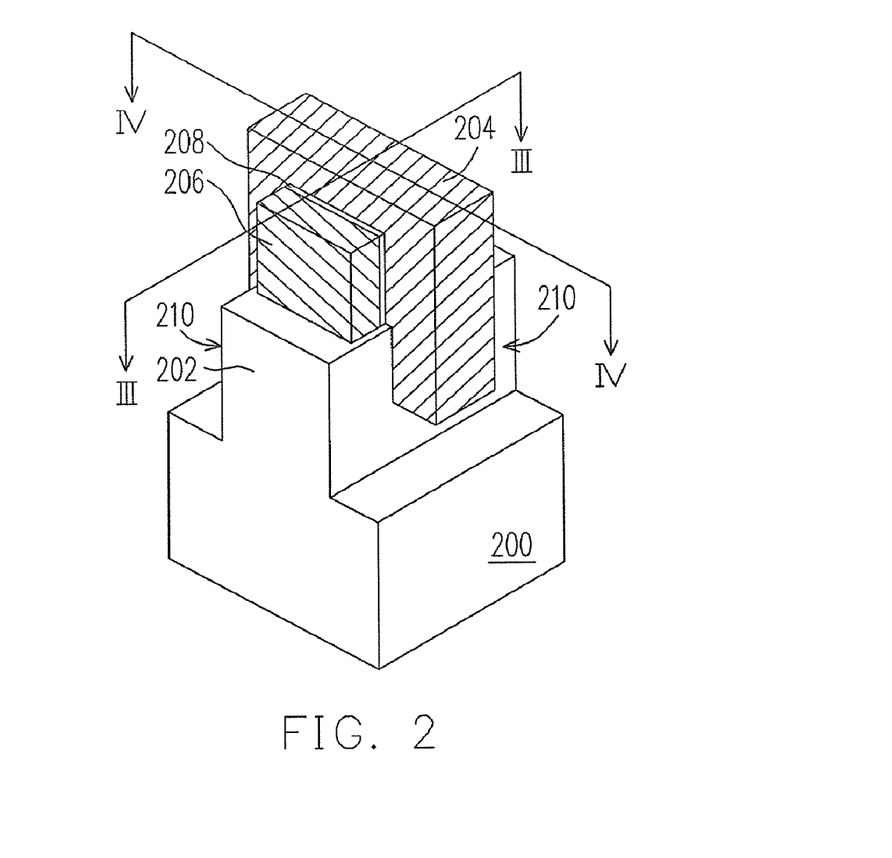
FIG. 2 is a perspective structural view of a flash memory according to a first embodiment of the present invention.
Figure 3:
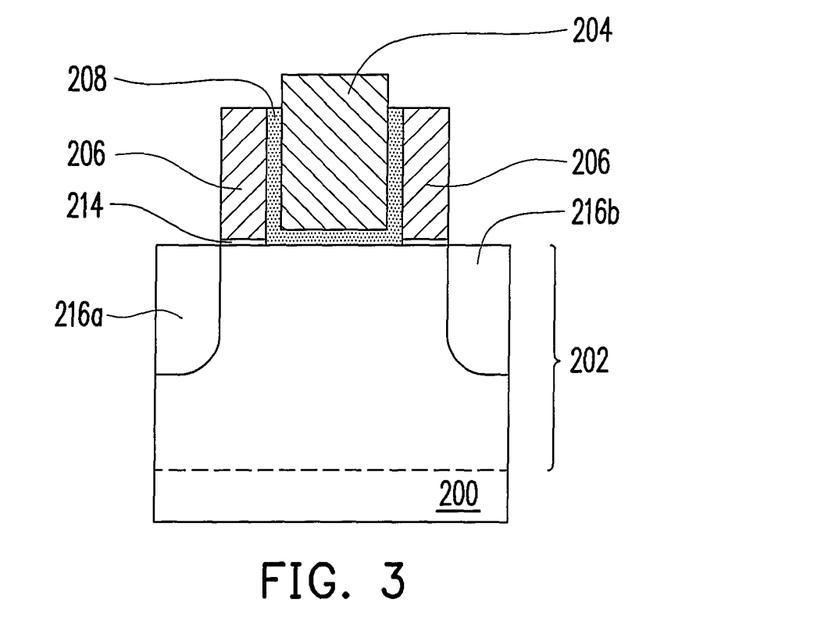
FIG. 3 is a cross-sectional view taken along a line segment III-III in FIG. 2.

FIG. 2 is a perspective structural view of a flash memory according to a first embodiment of the present invention, in which a part of the components are omitted to make the drawing clearer. FIG. 3 is a cross-sectional view taken along a line segment III-III in FIG. 2, and FIG. 4 is a cross-sectional view taken along a line segment IV-IV in FIG. 2.

Firstly, referring to FIG. 2, the flash memory of the first embodiment includes a substrate 200 having a protrusion 202 extending from a top face of the substrate 200, an control gate 204, two floating gates 206, and a dielectric layer 208. The control gate 204 in the drawing is formed on the protrusion 202 of the substrate 200 and extendedly covers two opposite sidewalls 210 of the protrusion 202. The floating gates 206 are respectively formed on top of the protrusion 202 of the substrate 200 and being on two opposite sides of the control gate 204. The dielectric layer 208 is sandwiched by the control gate 204 and the floating gates 206. The floating gates 206 are made of, for example, poly-silicon or another suitable material, the control gate 204 is made of, for example, poly-silicon or another suitable material, and the dielectric layer 208 includes, for example, an oxide-nitride-oxide structure or made of another suitable material.

Then, referring to FIG. 3, the flash memory of the first embodiment further includes an insulating layer 214, for example, tunneling oxide layer, sandwiched by the two floating gates 206 and the protrusion 202, and further includes a source 216a and a drain 216b respectively formed on two opposite sides of the protrusion 202 of the substrate 200 and each being adjacent to a respective one of the two floating gates 206.

Figure 4:
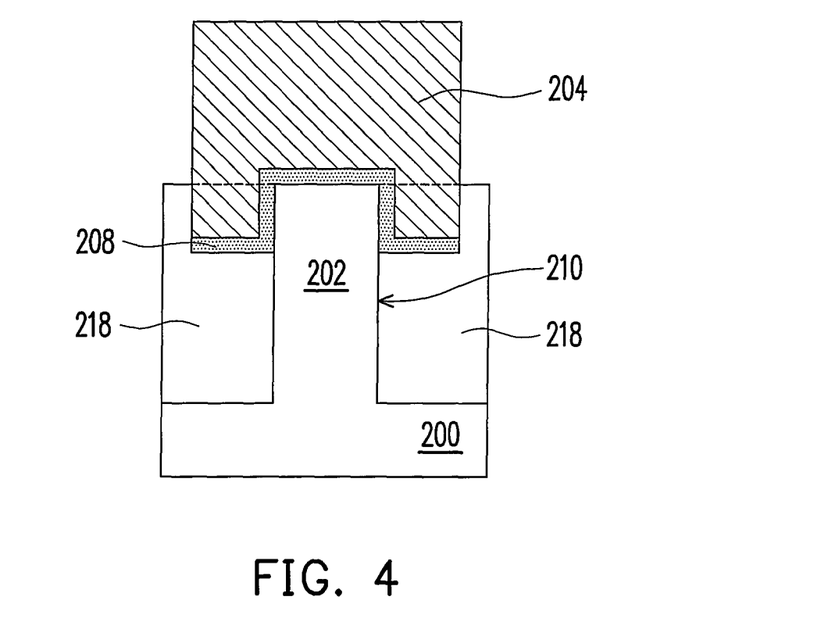
FIG. 4 is a cross-sectional view taken along a line segment IV-IV in FIG. 2.

Meanwhile, referring to FIG. 4, the substrate 200 of the first embodiment may further include two isolation structures 218, for example, shallow trench isolation (STI) structures, and the isolation structures 218 are formed on two opposite sides 210 of the protrusion 202 and surround the control gate 204. Due to the manufacturing process, the dielectric layer 208 may be further sandwiched by the control gate 204 and the protrusion 202.

Figure 5:
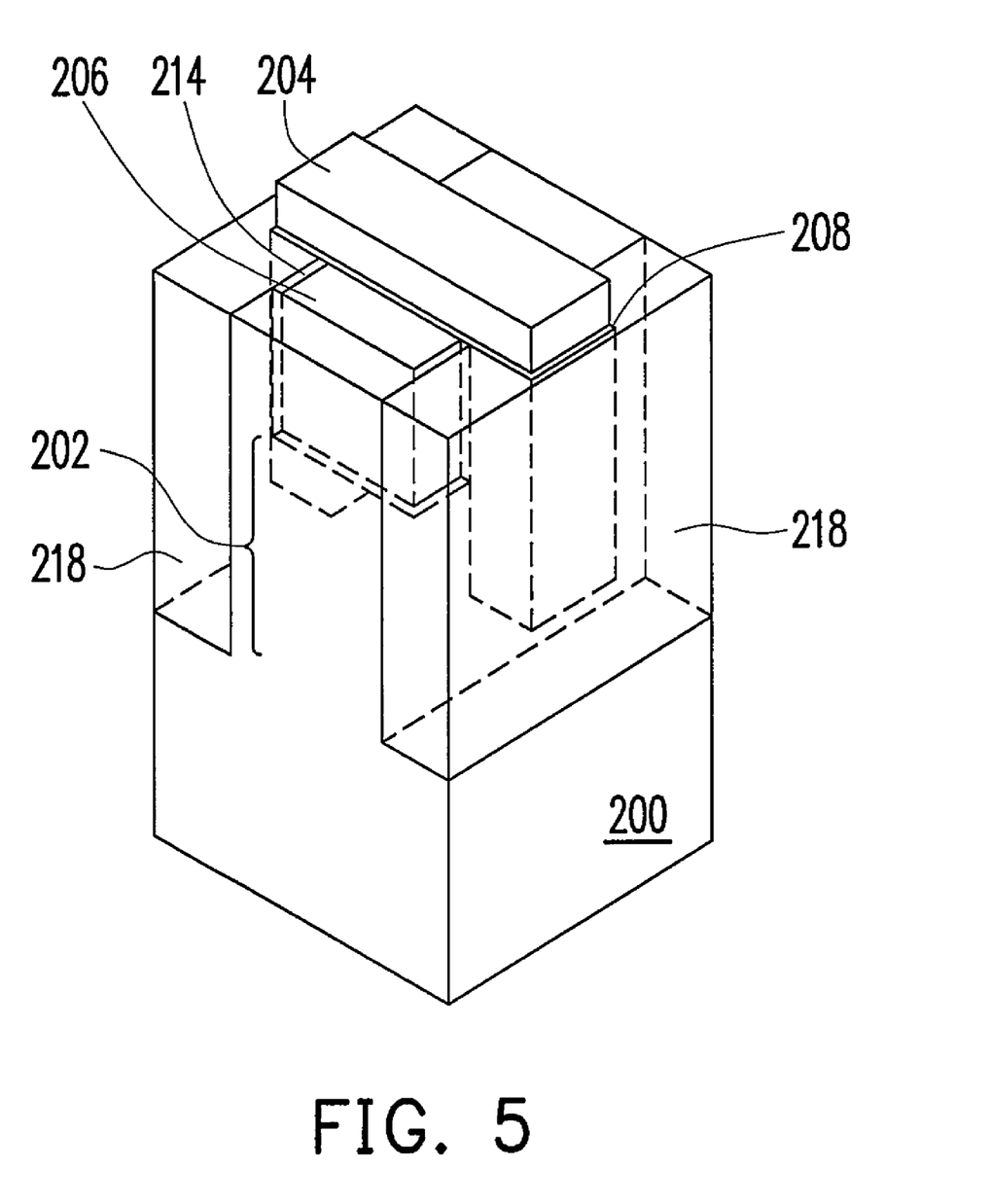
FIG. 5 shows a variation of the first embodiment of the present invention.

FIG. 5 is a variation of the first embodiment of the present invention, in which those element numerals the same as that of FIG. 2 are used to indicate the same components as that of FIG. 2.

As known from FIG. 5, it is different from the first embodiment in that, the top surface of the isolation structures 218 is coplanar with that of the two floating gates 206. Under comparison, the top surface of the isolation structures 218 in the first embodiment has a height lower than that of the bottom surface of the two floating gates 206.

In the following descriptions, steps for manufacturing a flash memory similar to that of the first embodiment are listed, but it does not mean that only the following steps can be used to manufacture the flash memory of the present invention.

FIGS. 6A to 6H are perspective views of a flow for manufacturing a flash memory according to a second embodiment of the present invention.

Figure 6A:
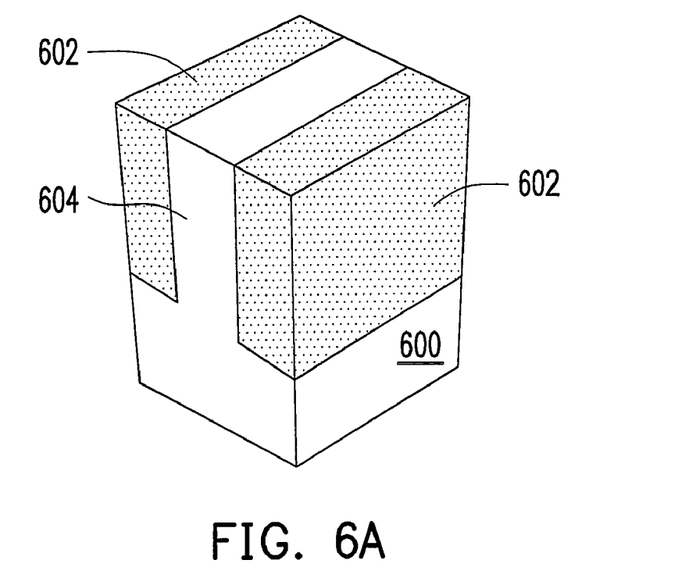
FIGS. 6A to 6H are perspective views of a flow for manufacturing a flash memory according to a second embodiment of the present invention.

Referring to FIG. 6A, a substrate 600 is provided, which has a plurality of isolation structures 602, for example, STI structures. A protrusion 604 of the substrate 600 is sandwiched by the isolation structures 602.

Figure 6B:
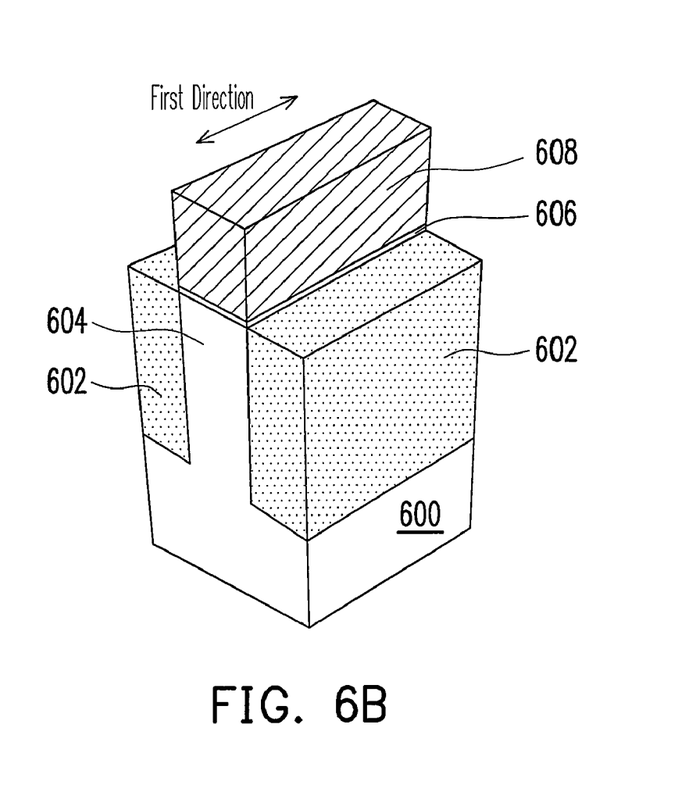

Next, referring to FIG. 6B, a thin insulating layer 606 is formed on the surface of the protrusion 604, and then a first conductor layer 608 extending towards a first direction is further formed on the insulating layer 606.

Figure 6C:
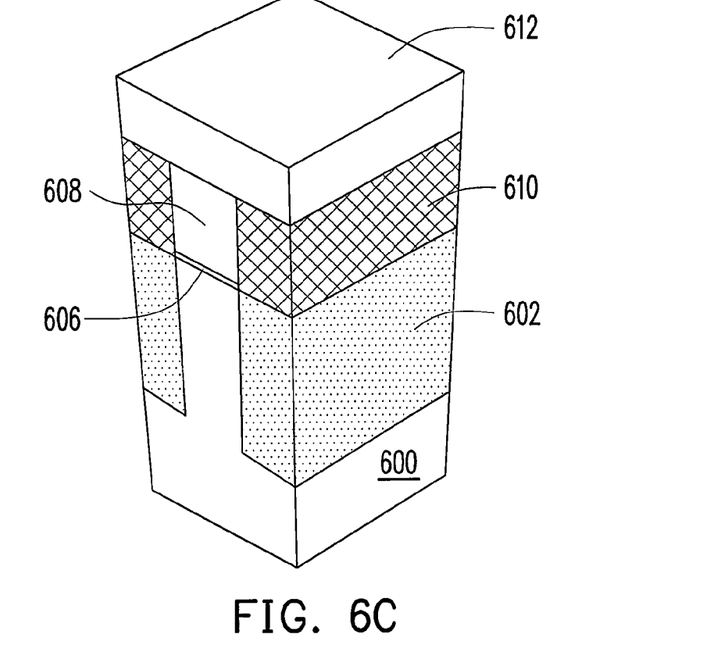

Then, referring to FIG. 6C, a dielectric layer 610 is formed on the isolation structures 602, and the dielectric layer 610 is approximately at a same level with the top surface of the first conductor layer 608. Then, a first mask layer 612 is formed on the substrate 600, for covering the dielectric layer 610 and the first conductor layer 608, in which the first mask layer 612 may be made of photoresist, silicon nitride, or another suitable material.

Figure 6D:
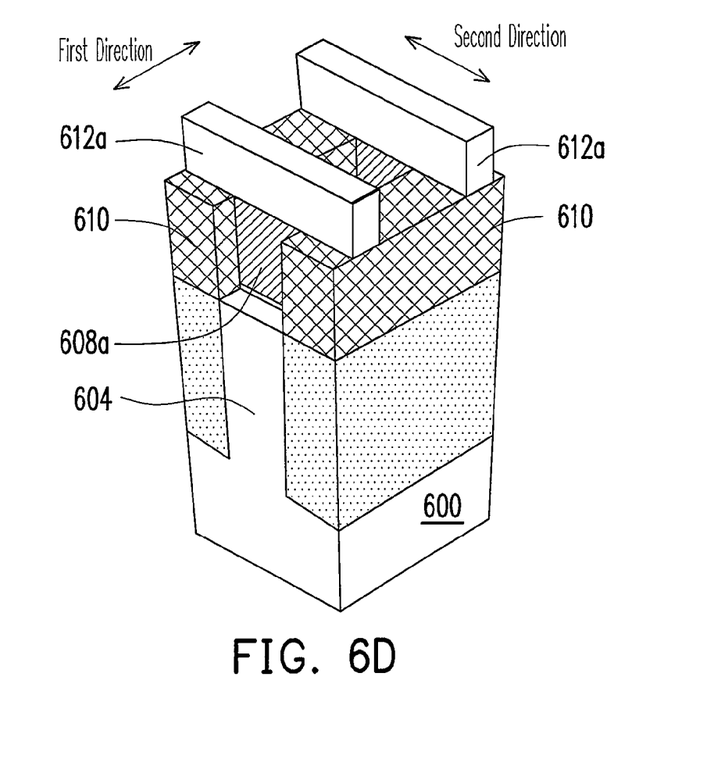

Then, referring to FIG. 6D, the first mask layer 612 is patterned into two strip-shaped masks 612a extending towards a second direction and serving as etching masks, so as to remove the exposed first conductor layer 608 and the insulating layer 606 under the exposed first conductor layer 608. In this embodiment, the first direction and the second direction are mutually perpendicular to each other. After etching, two floating gates 608a extending towards the first direction are finished.

Figure 6E:
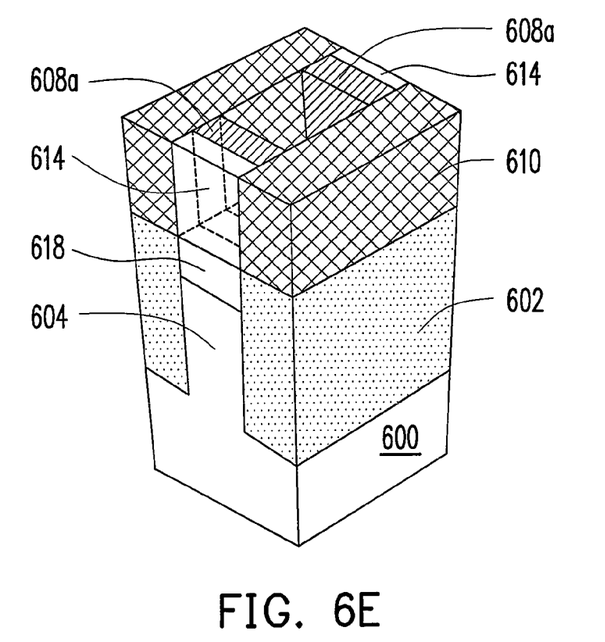

Then, referring to FIG. 6E, the strip-shaped masks 612a in the above drawing are removed, and then a source and a drain 618 are formed in the protrusion 604 on the outer side of the floating gates 608a. Then, another dielectric layer 614 is filled in the protrusion 604 on the outer side of the floating gates 608a. As for the process of forming the dielectric layer 614, the conventional exposure and development and deposition process may be used, which will not be repeatedly described here.

Figure 6F:
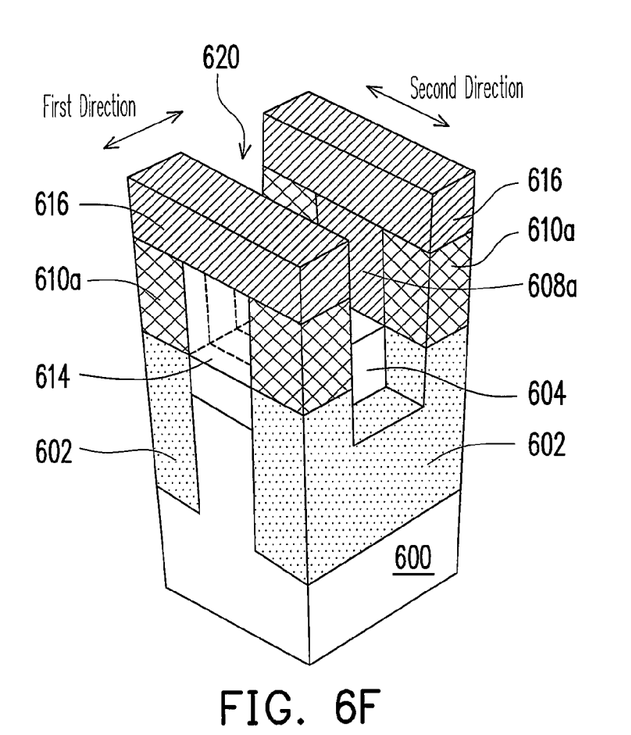

Then, referring to FIG. 6F, a second mask layer 616 for defining the control gate region is formed on the substrate 600, and covers the dielectric layer 614 and the floating gates 608a, which is made of photoresist, silicon nitride, or another suitable material. Then, the second mask layer 616 is used as the etching mask to remove the exposed dielectric layer 610 and a part of the isolation structure 602 under the exposed dielectric layer 610. After etching, an arcuate-shaped space 620 extending towards the second direction is formed on the substrate 600.

Figure 6G:
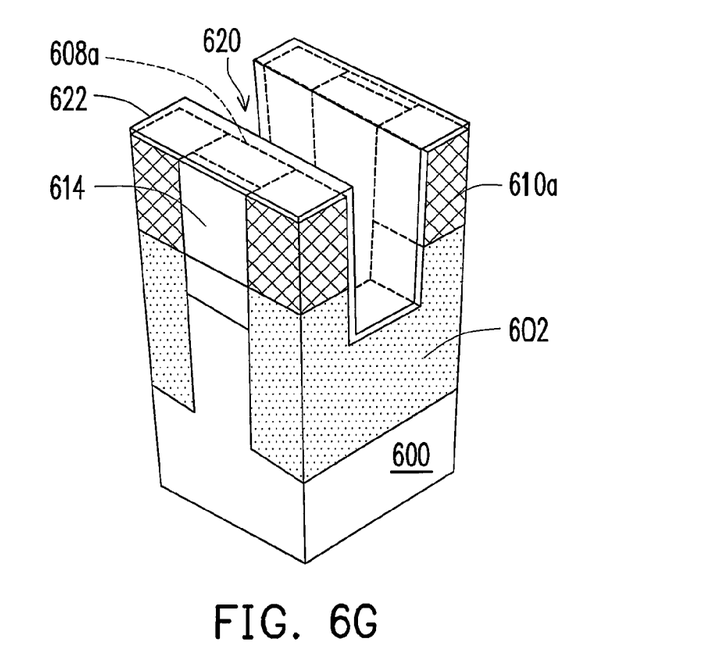

Then, referring to FIG. 6G; the second mask layer 616 in the above drawing is removed, and then a dielectric layer 622 is formed to cover the surface of the floating gates 608a. The dielectric layer 622 includes, for example, an oxide-nitride-oxide structure.

Figure 6H:
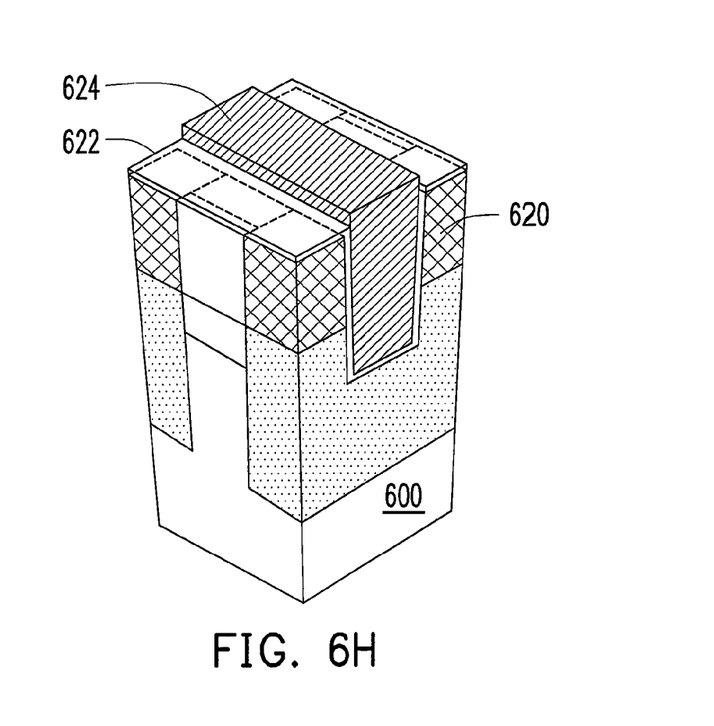

Finally, referring to FIG. 6H, an control gate 624 is formed in the space 620.

Figure 7:
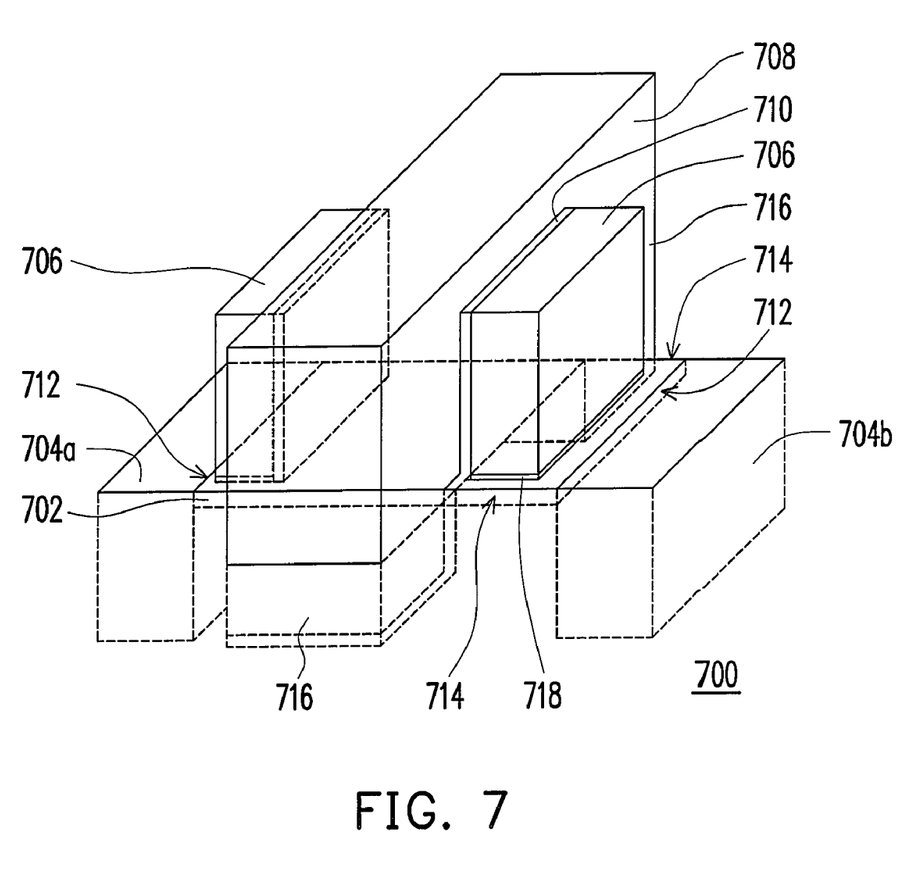
FIG. 7 is a perspective structural view of a flash memory according to a third embodiment of the present invention.

FIG. 7 is a perspective structural view of a flash memory according to a third embodiment of the present invention.

Referring to FIG. 7, the flash memory of the third embodiment includes a substrate 700 having a channel region 702, a source 704a and a drain 704b, two floating gates 706, a control gate 708, an insulating layer 718 and a dielectric layer 710. In the third embodiment, the channel region 702 includes a first set of two opposite sides 712 and a second set of two opposite sides 714 in the substrate 700, wherein the first set of two opposite sides 712 are orthogonal to the second set of two opposite sides 714, for example. The source 704a and the drain 704b are respectively formed on the first set of two opposite sides 712 of the channel region 702. The two floating gates 706 are respectively formed on two opposite sidewalls of the control gate 708 and on top of the channel region 702, which may be disposed on the substrate 700 as shown in the drawing, or may be disposed in the substrate 700. The control gate 708 is formed on top of the channel region 702 to cover a portion of a second set of two opposite sides 714 of the channel 702, in which a side portions 716 are disposed on the outer side of the second set of two opposite sides 714 of the channel region 702 and extend into the substrate 700. The insulating layer 718 is sandwiched by each of the two floating gates 706 and the channel region 702, and the dielectric layer 710 is sandwiched by the control gate 708 and the floating gates 706. In addition, the dielectric layer 710 may also be sandwiched by the control gate 708 and the channel region 702. In FIG. 7, a plurality of isolation structures (not shown) may be formed on the second set of two opposite sides 714 of the channel region 702 to sandwich therebetween the source 704a and the drain 704b, wherein a top surface of the isolation structures is coplanar with that of the two floating gates 706 or has a height lower than that of a bottom surface of the two floating gates 706. The floating gates 706 are made of, for example, poly-silicon or another suitable material, the control gate 708 is made of, for example, poly-silicon or another suitable material, and the dielectric layer 710 includes, for example, an oxide-nitride-oxide structure or made of another suitable material.

To sum up, the feature of the present invention lies in that, two side portions are further added to the two ends of the control gate of the two-bit flash memory, such that the control gate becomes an arcuate-shaped structure, so as to surround the channel region, and thus increasing the controllability of the control gate and enhancing the memory cell window.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory comprising:
   a substrate having a protrusion extending from a top face of the substrate;
   a control gate, formed on the protrusion of the substrate and extendedly covering two opposite sidewalls of the protrusion;
   two floating gates, formed on top of the protrusion and being on two opposite sides of the control gate respectively;
   a dielectric layer, sandwiched by the control gate and each of the two floating gates;
   a source and a drain, formed on two opposite sides of the protrusion respectively and each being adjacent to one of the two floating gates; and
   a plurality of isolation structures, formed on two opposite sides of the protrusion to sandwich therebetween the source and the drain,
   wherein a top surface of the isolation structures is coplanar with that of the two floating gates.

2. The flash memory as claimed in claim 1, wherein the dielectric layer is further sandwiched by the control gate and the protrusion.

3. The flash memory as claimed in claim 2, further comprising an insulating layer sandwiched by the two floating gates and the protrusion.

4. The flash memory as claimed in claim 1, wherein the dielectric layer comprises an oxide-nitride-oxide structure.

5. A flash memory comprising:
   a substrate, having a channel region;
   a source and a drain respectively formed on a first set of two opposite sides of the channel region in the substrate;
   a control gate, formed on top of the channel region to cover a portion of a second set of two opposite sides of the channel region;
   two floating gates, respectively formed on two opposite sidewalls of the control gate and on top of the channel region;
   an insulating layer, sandwiched by each of the two floating gates and the channel region;
   a dielectric layer, sandwiched by the control gate and the floating gates; and
   a plurality of isolation structures, formed on the second set of two opposite sides of the channel region to sandwich therebetween the source and the drain and each of the source and the drain being adjacent to one of the two floating gates,
   wherein a top surface of the isolation structures is coplanar with that of the two floating gates.

6. The flash memory as claimed in claim 5, wherein the first set of two opposite sides are orthogonal to the second set of two opposite sides of the channel region.

7. The flash memory as claimed in claim 5, wherein the dielectric layer is further sandwiched by the control gate and the channel region.

8. The flash memory as claimed in claim 7, wherein the dielectric layer comprises an oxide-nitride-oxide structure.

* * * * *